(12) United States Patent
Aldridge et al.

(10) Patent No.: US 11,205,701 B1
(45) Date of Patent: Dec. 21, 2021

(54) TRANSISTORS WITH SECTIONED EXTENSION REGIONS

(71) Applicant: GLOBALFOUNDRIES U.S. Inc., Santa Clara, CA (US)

(72) Inventors: Henry Aldridge, Malta, NY (US); John J. Ellis-Monaghan, Grand Isle, VT (US); Michel J. Abou-Khalil, Essex Junction, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 33 days.

(21) Appl. No.: 16/899,086

(22) Filed: Jun. 11, 2020

(51) Int. Cl.
*H01L 29/10* (2006.01)
*H01L 29/08* (2006.01)
*H01L 27/092* (2006.01)
*H01L 21/8238* (2006.01)

(52) U.S. Cl.
CPC .. *H01L 29/1033* (2013.01); *H01L 21/823814* (2013.01); *H01L 27/092* (2013.01); *H01L 29/0847* (2013.01); *H01L 29/1095* (2013.01)

(58) Field of Classification Search
CPC ............. H01L 29/1033; H01L 29/0847; H01L 29/1095; H01L 27/092; H01L 21/823814
USPC ......................................................... 257/401
See application file for complete search history.

(56) References Cited

U.S. PATENT DOCUMENTS

| 6,121,666 | A | 9/2000 | Burr |
| 6,475,868 | B1 | 11/2002 | Hao et al. |
| 7,704,844 | B2 * | 4/2010 | Zhu .................. H01L 29/66651 438/302 |
| 8,236,661 | B2 | 8/2012 | Dennard et al. |
| 8,574,991 | B2 | 11/2013 | Hoentschel et al. |
| 9,111,959 | B2 * | 8/2015 | Pang ................... H01L 29/1083 |
| 2007/0001232 | A1 * | 1/2007 | King ..................... H01L 21/78 257/368 |
| 2008/0179688 | A1 | 7/2008 | Thei et al. |
| 2009/0294850 | A1 * | 12/2009 | Breitwisch .......... H01L 29/7834 257/344 |
| 2011/0294270 | A1 * | 12/2011 | Nishisaka ........... H01L 29/6656 438/197 |

* cited by examiner

*Primary Examiner* — Igwe U Anya
(74) *Attorney, Agent, or Firm* — Thompson Hine LLP; Anthony Canale

(57) ABSTRACT

Structures for a field-effect transistor and methods of forming a structure for a field-effect transistor. A gate structure is formed over a channel region of a substrate. A first source/drain region is positioned in the substrate adjacent to a first sidewall of the gate structure, a second source/drain region is positioned in the substrate adjacent to a second sidewall of the gate structure, and an extension region is positioned in the substrate. The extension region includes first and second sections that each overlap with the first source/drain region. The first and second sections of the extension region are spaced apart along a longitudinal axis of the gate structure. A portion of the channel region is positioned along the longitudinal axis of the gate structure between the first and second sections of the extension region.

20 Claims, 4 Drawing Sheets

TRANSISTORS WITH SECTIONED EXTENSION REGIONS

BACKGROUND

The present invention relates to semiconductor device fabrication and integrated circuits and, more specifically, to structures for a field-effect transistor and methods of forming a structure for a field-effect transistor.

Complementary-metal-oxide-semiconductor (CMOS) processes may be employed to build a combination of p-type and n-type field-effect transistors that are used as devices to construct, for example, logic cells. Field-effect transistors generally include a source, a drain, a body supplying a channel region between the source and drain, and a gate electrode overlapped with the channel region. When a control voltage exceeding a characteristic threshold voltage is applied to the gate electrode, carrier flow occurs in the channel region between the source and drain to produce a device output current.

As device size increases, the capacitance when the device is 'OFF' (i.e., Coff) increases and the resistance when the device is 'ON' (i.e., Ron) decreases, but the product of Coff and Ron (i.e., the figure of merit) remains constant. Historical approaches to improve the figure of merit have included strain engineering for higher carrier mobility, gate oxide scaling, and different device geometries (e.g., fin-type field-effect transistors).

Improved structures for a field-effect transistor and methods of forming a structure for a field-effect transistor are needed.

SUMMARY

In an embodiment of the invention, a structure for a field-effect transistor is provided. The structure includes a gate structure over a channel region of a substrate. The gate structure has a longitudinal axis, a first sidewall, and a second sidewall opposite to the first sidewall. The structure further includes a first source/drain region in the substrate adjacent to the first sidewall of the gate structure, a second source/drain region in the substrate adjacent to the second sidewall of the gate structure, and an extension region in the substrate. The extension region includes a first section and a second section that each overlap with the first source/drain region. The first section and the second section of the extension region are spaced apart along the longitudinal axis of the gate structure. A portion of the channel region is positioned along the longitudinal axis of the gate structure between the first section and the second section of the extension region.

In an embodiment of the invention, a method of forming a structure for a field-effect transistor is provided. The method includes forming a gate structure that is arranged over a channel region of a substrate, forming a first source/drain region in the substrate adjacent to a first sidewall of the gate structure, forming a second source/drain region in the substrate adjacent to a second sidewall of the gate structure, and forming an extension region in the substrate. The extension region includes a first section and a second section that each overlap with the first source/drain region, and the first section and the second section of the extension region are spaced apart along a longitudinal axis of the gate structure. A portion of the channel region is positioned along the longitudinal axis of the gate structure between the first section and the second section of the extension region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
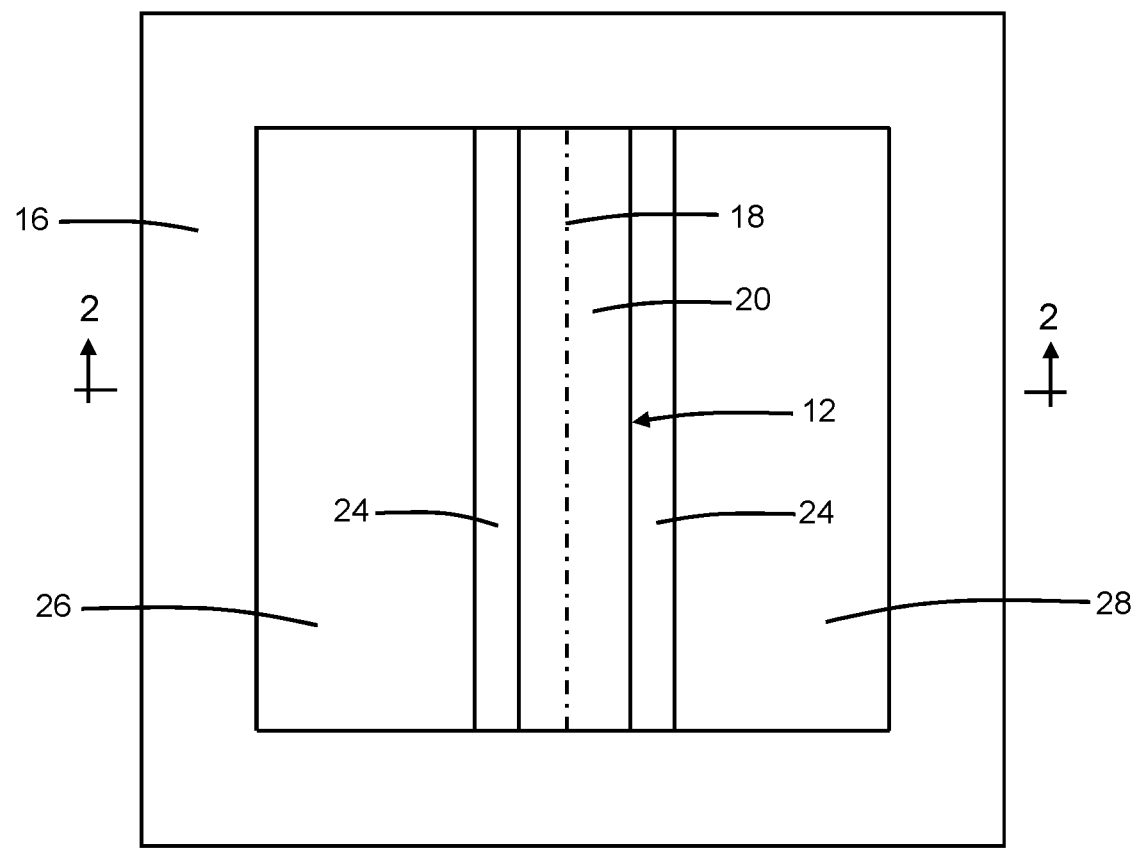
FIG. 1 is a top view of a structure for a field-effect transistor in accordance with embodiments of the invention.
Figure 2:
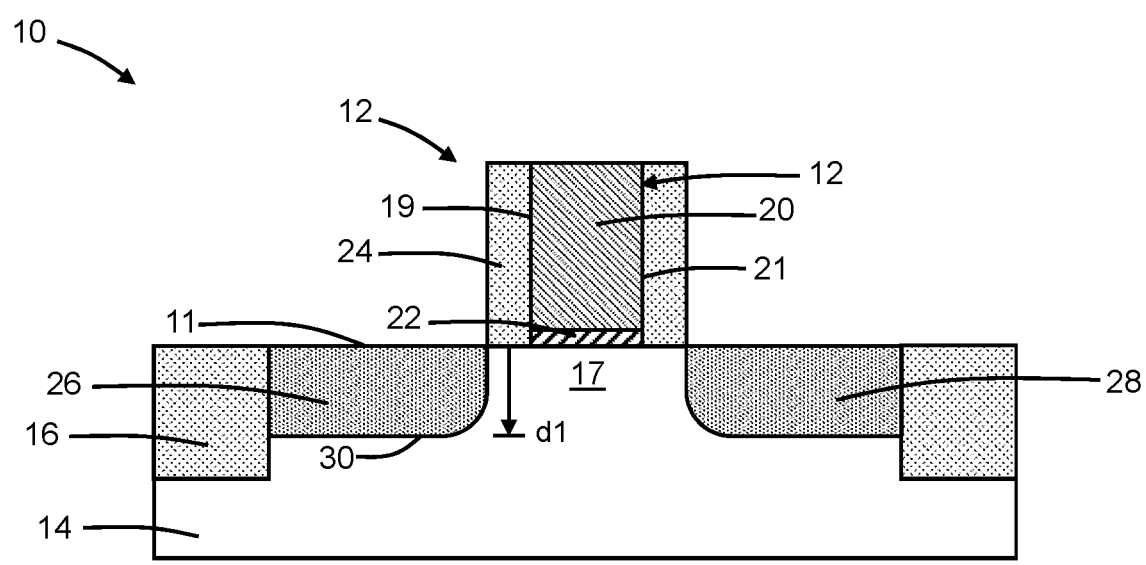
FIG. 2 is a cross-sectional view taken generally along line 2-2 in FIG. 1.

With reference to FIGS. 1, 2 and in accordance with embodiments of the invention, a structure 10 for a field-effect transistor includes a gate structure 12 that is arranged over a substrate 14. The substrate 14 may be comprised of a single-crystal semiconductor material, such as single-crystal silicon, that is lightly doped (e.g., lightly p-type doped). Shallow trench isolation regions 16 may surround an active region of the substrate 14. The shallow trench isolation regions 16 may be formed by defining trenches in the substrate 14 with lithography and etching processes, depositing a layer comprised of a dielectric material (e.g., silicon dioxide) by chemical vapor deposition, and planarizing with chemical-mechanical polishing.

The gate structure 12 extends laterally along a longitudinal axis 18 over and across the active area of the substrate 14. The gate structure 12 may include a gate electrode 20 composed of a conductor, such as doped polycrystalline silicon (i.e., polysilicon) or a work function metal, and a gate dielectric 22 composed of an electrical insulator, such as silicon dioxide or a high-k dielectric material such as hafnium oxide. Sidewall spacers 24 are arranged adjacent to the side surfaces or sidewalls 19, 21 of the gate structure 12. The sidewall spacers 24 may be formed by depositing a conformal layer comprised of a dielectric material (e.g., silicon nitride) over the gate structures 12 and etching the deposited conformal layer with an anisotropic etching process, such as reactive ion etching.

The structure 10 includes a source/drain region 26 and a source/drain region 28 that are arranged proximate to the opposite spacer-clad sidewalls 19 of the gate structure 12. As used herein, the term "source/drain region" means a doped region of semiconductor material that can function as either a source or a drain of a field-effect transistor. In an embodiment, the source/drain region 26 may provide a source in the structure 10, and the source/drain region 28 may provide a drain in the structure 10. In an alternative embodiment, the source/drain region 26 may provide a drain in the structure 10, and the source/drain region 28 may provide a source in the structure 10.

The source/drain regions 26, 28 are doped to have a conductivity type of the same polarity. To that end, the source/drain regions 26, 28 may be concurrently formed by an ion implantation process in respective portions of the substrate 14. The source/drain regions 26, 28 contain a concentration of an n-type or p-type dopant and may be heavily doped. In an embodiment, the source/drain regions 26, 28 may be formed in the substrate 14 by implanting ions of a p-type dopant (e.g., boron) that provides p-type electrical conductivity. In an alternative embodiment, the source/drain regions 26, 28 may be formed in the substrate 14 by implanting ions of an n-type dopant (e.g., phosphorus and/or arsenic) that provides n-type conductivity. The dopant concentrations of the source/drain region 26 and the source/drain region 28 may be equal or substantially equal.

Ion implantation introduces energetic ions, as indicated diagrammatically by the single-headed arrows, with ion trajectories that stop over a depth range in the substrate 14. The ions may be generated from a suitable source gas and implanted into the substrate 14 with given implantation conditions using an ion implantation tool. The implantation conditions (e.g., ion species, dose, kinetic energy, tilt angle) may be selected to tune the characteristics (e.g., depth profile) of the source/drain region 28. The gate structure 12 may function to self-align the ion implantation process forming the source/drain regions 26, 28.

The source/drain regions 26, 28 may have a top surface coincides with a top surface 11 of the substrate 14, and the source/drain regions 26, 28 may be located entirely at and below the top surface 11 of the substrate 14. A channel region 17, which is provided by a portion of the substrate 14, is laterally arranged between the source/drain region 26 and the source/drain region 28. The source/drain region 26 has a boundary 30 defining an interface at which the conductivity type changes from that of the source/drain region 26 to that of the channel region 17. The source/drain region 28 also has a boundary 30 defining an interface at which the conductivity type changes from that of the source/drain region 28 to that of the channel region 17. The boundaries 30 extend to a depth, dl, relative to the top surface 11 of the substrate 14.

Figure 3:
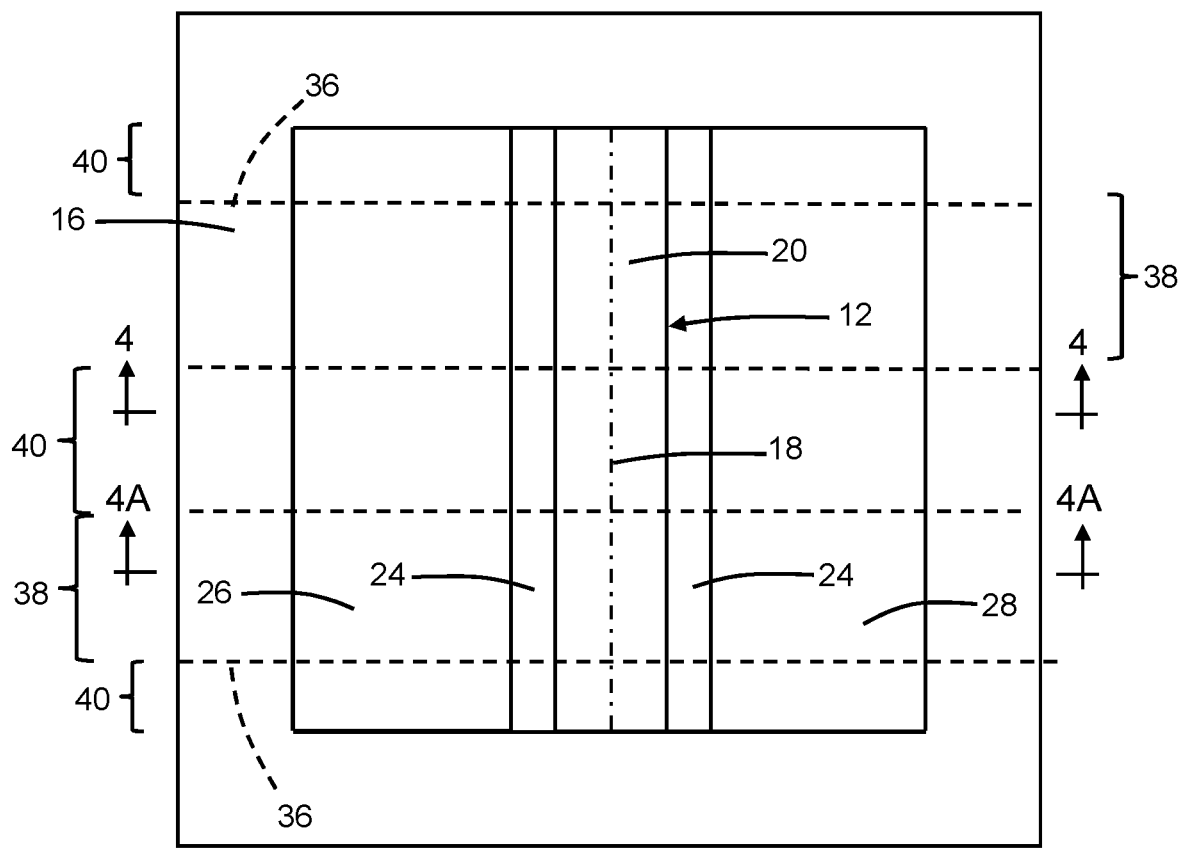
FIG. 3 is a top view of the structure at a fabrication stage subsequent to FIG. 1.
Figure 4:
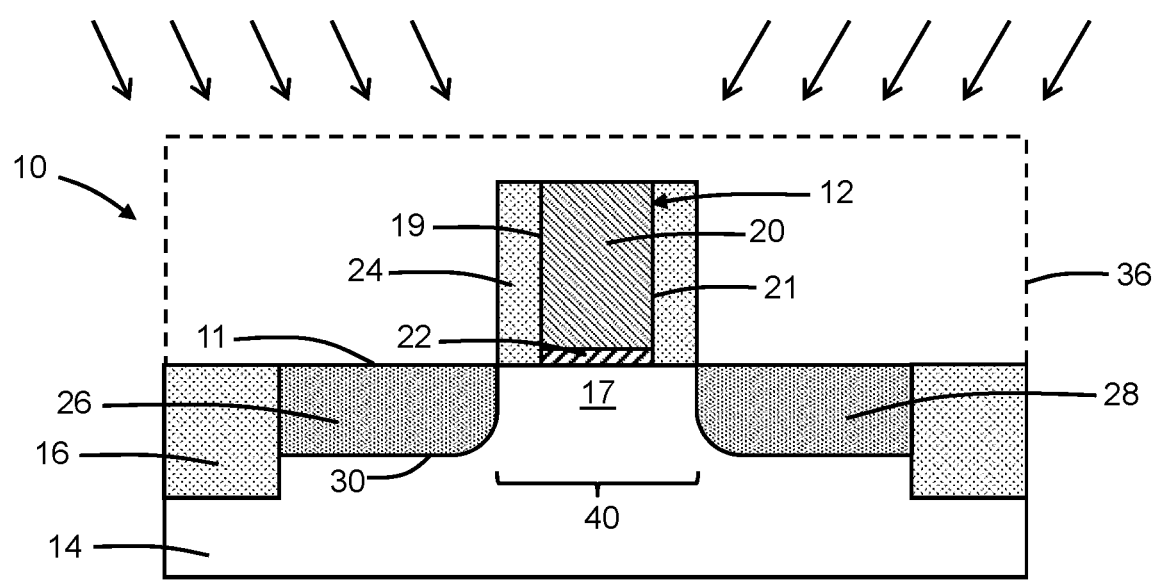
FIG. 4 is a cross-sectional view taken generally along line 4-4 in FIG. 3.
Figure 4A:
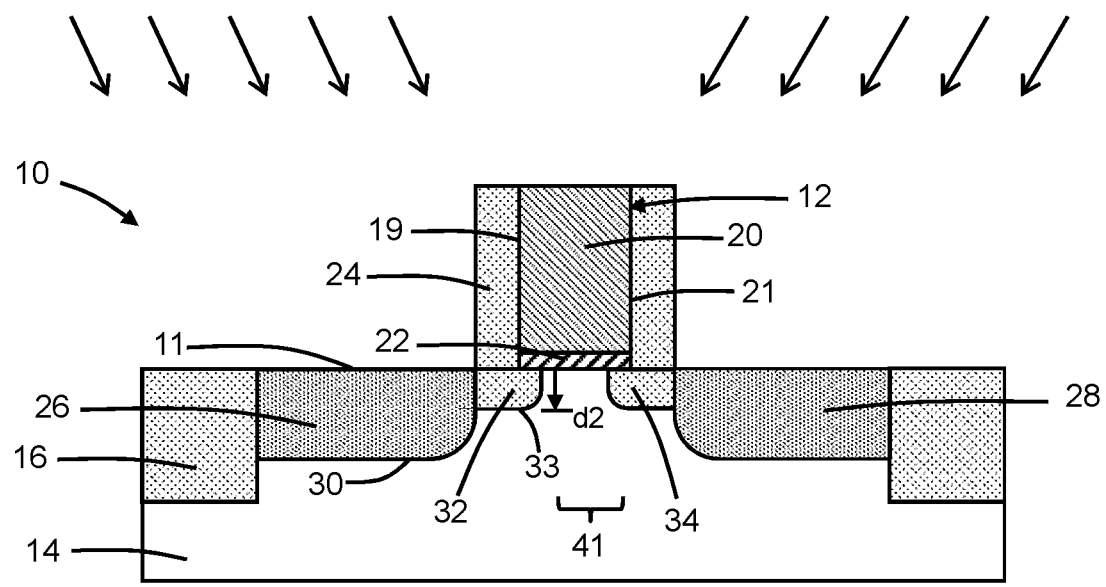
FIG. 4A is a cross-sectional view taken generally along line 4A-4A in FIG. 3.

With reference to FIGS. 3, 4, 4A in which like reference numerals refer to like features in FIGS. 1, 2 and at a subsequent fabrication stage, an extension region 32 may be provided adjacent to the source/drain region 26, and an extension region 34 may be provided adjacent to the source/drain region 28. The extension regions 32, 34 may be formed in patterned sections 38 by a masked ion implantation process. To that end, an implantation mask 36 may be formed by a lithography process that includes openings arranged over unmasked portions of the substrate 14 in which the sections of the extension regions 32, 34 are formed. The implantation mask 36 may include a layer of, for example, an organic photoresist that is applied by a spin coating process, pre-baked, exposed to light projected through a photomask, baked after exposure, and developed with a chemical developer. After forming the implantation mask 36, the sections 38 of the extension region 32 and the sections 38 of the extension region 34 may be formed in the unmasked portions of the substrate 14 by ion implantation.

The sections 38 of the extension regions 32, 34 contain a concentration of a dopant of the same type of electrical conductivity (i.e., polarity type) as the dopant contained in the source/drain regions 26, 28 and may be heavily doped. In an embodiment in which the source/drain regions 26, 28 have p-type electrical conductivity, the sections 38 of the extension regions 32, 34 may be formed in the substrate 14 by implanting ions of a p-type dopant (e.g., boron) that provides p-type electrical conductivity. In an alternative embodiment in which the source/drain regions 26, 28 have n-type electrical conductivity, the sections 38 of the extension regions 32, 34 may be formed in the substrate 14 by implanting ions of an n-type dopant (e.g., phosphorus and/or arsenic) that provides n-type conductivity. The dopant concentrations of the sections 38 of the extension region 32 and the sections 38 of the extension region 34 may be equal or substantially equal.

An ion implantation process introduces energetic ions, as indicated diagrammatically by the single-headed arrows, with ion trajectories that stop over a depth range in the substrate 14. The ions may be generated from a suitable source gas and implanted into the substrate 14 with given implantation conditions using an ion implantation tool. The implantation conditions (e.g., ion species, dose, kinetic energy, tilt angle) may be selected to tune the characteristics (e.g., depth profile) of the sections 38 of the extension regions 32, 34. The implantation mask 36 has a thickness sufficient to stop the energetic ions before reaching masked portions of the substrate 14. Following the formation of the sections 38 of the extension regions 32, 34, the implantation mask 36 may be removed by, for example, ashing.

The sections 38 of the extension regions 32, 34 are positioned at spaced-apart locations beneath the gate structure 12 and its sidewall spacers 24 that reflect the locations of the openings in the implantation mask 36. Each section 38 of the extension region 32 and each section 38 of the extension region 34 has a boundary 33 defining an interface at which the conductivity type changes from that of the extension regions 32, 34 to that of the substrate 14. The boundary 33 extends to a depth, dl, relative to the top surface 11 of the substrate 14. The sections 38 of the extension regions 32, 34 effectively shorten the gate length, as well as the width dimension of the channel region 17, at the location of the sections 38.

The sections 38 of the extension region 32 overlap with the source/drain region 26 and extend laterally from the source/drain region 26 to terminate at a side edge of the boundary 33. The sections 38 of the extension region 32 are laterally positioned with a spaced-apart arrangement along the longitudinal axis 18 of the gate structure 12. The sections 38 of the extension region 32 are positioned in a direction transverse to the longitudinal axis 18 beneath the sidewall spacer 24 at the sidewall 19 of the gate structure 12 and beneath a portion of the gate structure 12.

The sections 38 of the extension region 34 overlap with the source/drain region 28 and extend laterally from the source/drain region 28 to terminate at a side edge of the boundary 33. The sections 38 of the extension region 34 are also spaced apart along the longitudinal axis 18 of the gate structure 12 (i.e., in a direction parallel to the longitudinal axis 18). The sections 38 of the extension region 34 are also positioned in a direction transverse to the longitudinal axis 18 beneath the sidewall spacer 24 at the sidewall 21 of the gate structure 12 and beneath a portion of the gate structure 12.

In an embodiment, the sections 38 of the extension regions 32, 34 may have a constant pitch along the longitudinal axis 18 of the gate structure 12. In an embodiment, the sections 38 of the extension regions 32, 34 may have a variable pitch along the longitudinal axis 18 of the gate structure.

Portions 40 of the channel region 17 are laterally positioned along the longitudinal axis 18 of the gate structure 12 between the sections 38 of the extension region 32. The portions 40 of the channel region 17 may fully separate adjacent sections 38 of the extension region 32 from each other and may be coextensive with (i.e., share a common boundary with) the source/drain region 26 over a portion of its boundary 30. Portions 40 of the channel region 17 are also laterally positioned along the longitudinal axis 18 between the sections 38 of the extension region 34 and may be coextensive with (i.e., share a common boundary with) the source/drain region 28 over a portion of its boundary 30. The portions 40 may fully separate adjacent sections 38 of the extension region 34 from each other. The portions 40 span in a direction transverse to the longitudinal axis 18 from one end at the boundary 30 of the source/drain region 26 to an opposite end at the boundary 30 of the source/drain region 28.

Portions 41 of the channel region 17 are laterally positioned between the sections 38 of the extension region 32 and between the sections 38 of the extension region 34 in a direction transverse to the longitudinal axis 18. The portions 40 of the channel region 17 may be wider than the portions 41 in the transverse direction, and the portions 40 may extend from the boundary 30 shared with the source/drain region 26 to the boundary 30 shared with the source/drain region 28.

In combination, the sections 38 of the extension region 32 and the portions 40 of the channel region 17 provide a modulated doping profile in a direction parallel to the longitudinal axis 18 of the gate structure 12 and adjacent to the sidewall 19 of the gate structure 12. Similarly, in combination, the sections 38 of the extension region 34 and the portions 40 of the channel region 17 provide a modulated doping profile in a direction parallel to the longitudinal axis 18 of the gate structure 12 and adjacent to the sidewall 21 of the gate structure 12. Due to the masking during their formation, the different modulated doping profiles match in a direction along the longitudinal axis 18.

The sectioned extension regions 32, 34 may provide a significant improvement to the figure of merit, in comparison to non-sectioned extension regions, through capacitance (Coff) reduction. The improvement may be achieved without strain engineering or gate oxide scaling, and without resorting to a different device geometry (e.g., a fin-type field-effect transistor).

In an alternative embodiment, the extension region 32 and the extension region 34 may be formed in an asymmetrical manner. In that regard, the extension region 32 may be formed with the sections 38, and the extension region 34 may be formed in its entirety without masking such that the extension region 34 lacks the sections 38. The extension region 34 may therefore be continuous and lack the portions 40 of the channel region 17.

Middle-of-line (MOL) processing and back-end-of-line (BEOL) processing follow, which includes formation of metal features, such as contacts, vias, and wiring, for an interconnect structure that is coupled with the field-effect transistor. The interconnect structure may be formed by depositing interlayer dielectric layers composed of dielectric material and forming the metal features in the various interlayer dielectric layers to define metallization levels.

Figure 5:
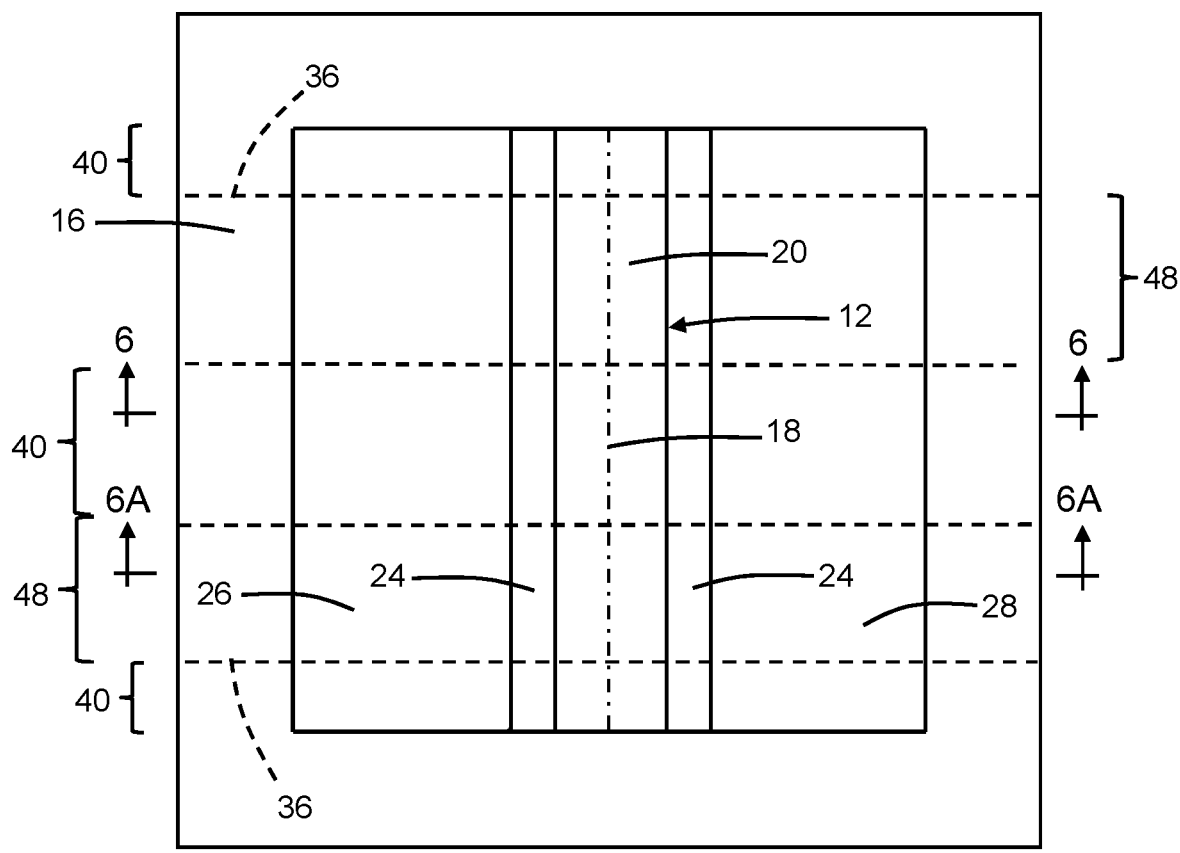
FIG. 5 is a top view of a structure for a field-effect transistor in accordance with alternative embodiments of the invention.
Figure 6:
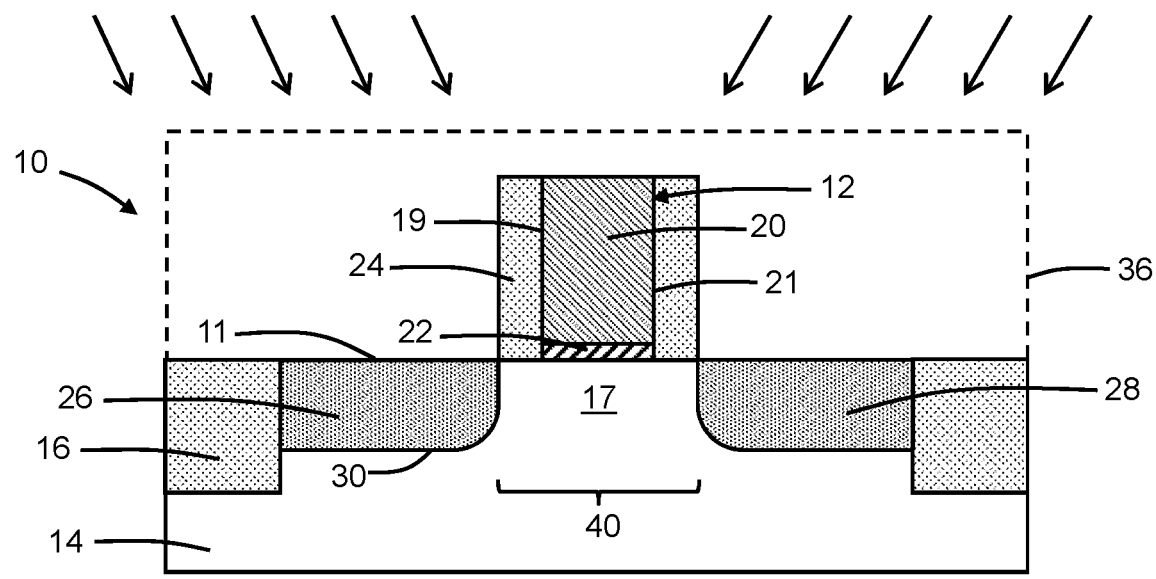
FIG. 6 is a cross-sectional view taken generally along line 6-6 in FIG. 5.
Figure 6A:
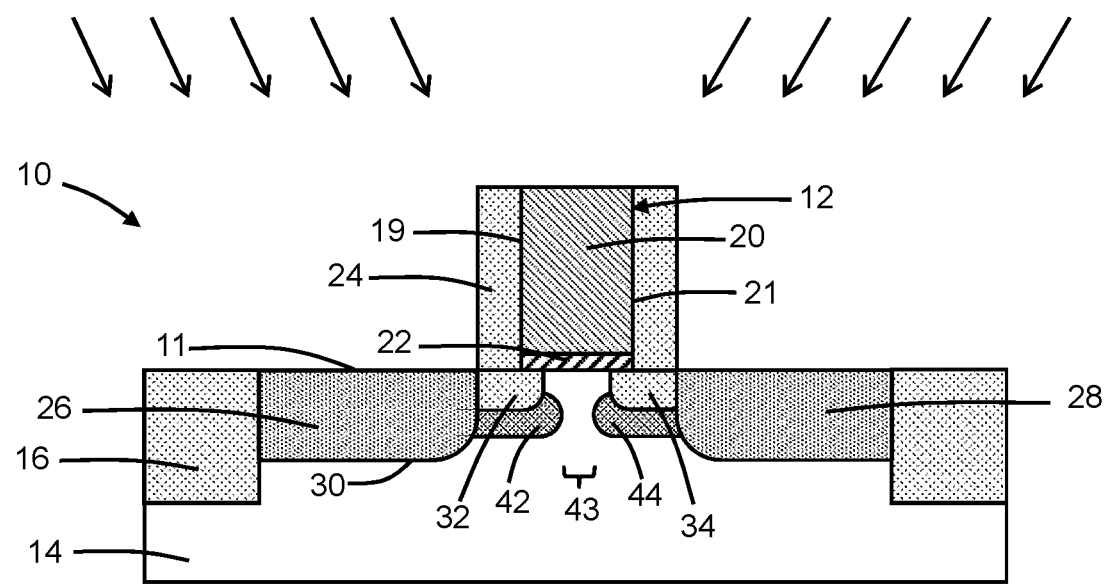
FIG. 6A is a cross-sectional view taken generally along line 6A-6A in FIG. 5.

With reference to FIGS. 5, 6, 6A in which like reference numerals refer to like features in FIGS. 4, 4A and in accordance with alternative embodiments of the invention, the structure 10 may include a halo region 42 and a halo region 44 that are each formed in sections 48 by ion implantation with the implantation mask 36 in place. The sections 48 of the halo region 42 may coincide in position and overlap with the sections 38 of the extension region 32. The sections 48 of the halo region 44 may coincide in position and overlap with the sections 38 of the extension region 34. The halo regions 42, 44 extend to a greater depth in the substrate 14 than the extension regions 32, 34.

The sections 48 of the halo regions 42, 44 may be positioned laterally along the longitudinal axis 18 of the gate structure 12 and spaced apart by the unimplanted portions 40 of the channel region 17. The sections 48 of the halo regions 42, 44 are generally located beneath the boundary 33 of the extension regions 32, 34 and beneath at least a portion of the boundary of the source/drain regions 26, 28. The portions 40 of the channel region 17 are laterally positioned along the longitudinal axis 18 of the gate structure 12 between the sections 48 of the halo region 42. The portions 40 fully separate adjacent sections 48 of the halo region 42 from each other. The portions 40 of the channel region 17 are also laterally positioned along the longitudinal axis 18 of the gate structure 12 between the sections 48 of the halo region 44. The portions 40 fully separate adjacent sections 48 of the halo region 44 from each other. Portions 43 of the channel region 17 are also laterally positioned in a direction transverse to the longitudinal axis 18 of the gate structure 12 between the sections 48 of the halo region 42 and the sections 48 of the halo region 44. The portions 40 are wider than the portions 43 in the transverse direction, and the portions 41 (FIG. 4A) are also wider than the portions 43 in the transverse direction.

The halo regions 42, 44 contain a concentration of a dopant having the opposite type of electrical conductivity (i.e., polarity type) to the dopant contained in the source/drain regions 26, 28 and the extension regions 32, 34. The halo regions 42, 44 have the same conductivity type as the channel region 17 and locally increase the doping concentration of the channel region 17. In the latter regard, that the halo regions 42, 44 have a higher dopant concentration than the unimplanted channel region 17. In an embodiment in which the source/drain regions 26, 28 and the extension regions 32, 34 have p-type electrical conductivity, the halo regions 42, 44 may be formed by implanting ions of an n-type dopant (e.g., phosphorus and/or arsenic) that provides n-type electrical conductivity. In an alternative embodiment in which the source/drain regions 26, 28 and the extension regions 32, 34 have n-type electrical conductivity, the halo regions 42, 44 may be formed by implanting ions of a p-type dopant (e.g., boron) that provides p-type conductivity. The halo region 42 and the halo region 44 may have equal or substantially equal dopant concentrations.

An ion implantation process introduces energetic ions, as indicated diagrammatically by the single-headed arrows, with ion trajectories that stop over a depth range in the substrate 14. The ions may be generated from a suitable source gas and implanted into the substrate 14 with given implantation conditions using an ion implantation tool. The implantation conditions (e.g., ion species, dose, kinetic energy, tilt angle) may be selected to tune the characteristics (e.g., depth profile) of the halo regions 42, 44. The implantation mask 36 has a thickness sufficient to stop the energetic ions before reaching masked portions of the substrate 14. Following the formation of the extension regions 32, 34 and the halo regions 42, 44, the implantation mask 36 may be removed by, for example, ashing.

In an alternative embodiment, the extension regions 32, 34 and the halo regions 42, 44 may be formed in an asymmetrical manner. In that regard, the extension region 32 may be formed with the sections 38 and the halo region 42 may be formed with the sections 48, and the extension region 34 and the halo region 44 may be formed in their entirety without masking such that the extension region 34 lacks the sections 38 and the halo region 44 lacks the sections 48. The extension region 34 and the halo region 44 are continuous along the longitudinal axis 18 of the gate structure and lack the portions 40 of the channel region 17.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/− 10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
    a substrate including a channel region;
    a gate structure over the channel region, the gate structure having a longitudinal axis, a first sidewall, and a second sidewall opposite to the first sidewall;
    a first source/drain region in the substrate adjacent to the first sidewall of the gate structure;
    a second source/drain region in the substrate adjacent to the second sidewall of the gate structure; and
    a first extension region in the substrate adjacent to the first source/drain region, the first extension region including a first section and a second section that are spaced apart along the longitudinal axis of the gate structure,
    wherein the channel region includes a first portion positioned along the longitudinal axis of the gate structure between the first section and the second section of the first extension region.

2. The structure of claim 1 wherein the first portion of the channel region is coextensive with the first source/drain region, and the first extension region is coextensive with the first source/drain region.

3. The structure of claim 1 wherein the first portion of the channel region fully separates the first section of the first extension region and the second section of the first extension region.

4. The structure of claim 1 wherein the first extension region has a first conductivity type, and the channel region has a second conductivity type opposite to the first conductivity type.

5. The structure of claim 1 further comprising:
    a second extension region in the substrate adjacent to the second source/drain region, the second extension region including a first section and a second section that are spaced apart along the longitudinal axis of the gate structure.

6. The structure of claim 5 wherein the channel region includes a second portion positioned along the longitudinal axis of the gate structure between the first section and the second section of the second extension region.

7. The structure of claim 5 wherein the channel region includes a second portion positioned transverse to the longitudinal axis of the gate structure between the first section of the first extension region and the first section of the second extension region, and the channel region includes a third portion positioned transverse to the longitudinal axis of the gate structure between the second section of the first extension region and the second section of the second extension region.

8. The structure of claim 1 further comprising:
    a first halo region in the substrate, the first halo region including a first section beneath the first section of the first extension region and a second section beneath the second section of the first extension region, and the first section and the second section of the first halo region spaced apart along the longitudinal axis of the gate structure.

9. The structure of claim 8 wherein the channel region includes a second portion positioned along the longitudinal axis of the gate structure between the first section and the second section of the first halo region.

10. The structure of claim 8 further comprising:
    a second extension region in the substrate adjacent to the second source/drain region, the second extension region including a first section and a second section that are spaced apart along the longitudinal axis of the gate structure.

11. The structure of claim 10 further comprising:
a second halo region in the substrate, the second halo region including a first section beneath the first section of the second extension region and a second section beneath the second section of the second extension region, and the first section and the second section of the second halo region spaced apart along the longitudinal axis of the gate structure.

12. The structure of claim 11 wherein the channel region includes a second portion positioned along the longitudinal axis of the gate structure between the first section and the second section of the second halo region.

13. The structure of claim 8 wherein the first extension region has a first conductivity type, the channel region and the first halo region have a second conductivity type opposite to the first conductivity type, and the first halo region contains a higher dopant concentration than the channel region.

14. A method of forming a structure for a field-effect transistor, the method comprising:
forming a gate structure that is arranged over a channel region of a substrate;
forming a first source/drain region in the substrate adjacent to a first sidewall of the gate structure;
forming a second source/drain region in the substrate adjacent to a second sidewall of the gate structure; and
forming a first extension region in the substrate adjacent to the first source/drain region,
wherein the first extension region includes a first section and a second section that are spaced apart along a longitudinal axis of the gate structure, and the channel region includes a first portion positioned along the longitudinal axis of the gate structure between the first section and the second section of the first extension region.

15. The method of claim 14 wherein forming the first extension region in the substrate comprises:
forming a patterned mask over the substrate; and
introducing a dopant into the substrate with the patterned mask over the substrate to form the first section and the second section of the first extension region.

16. The method of claim 15 wherein the dopant is introduced by an ion implantation process.

17. The method of claim 14 further comprising:
forming a second extension region in the substrate adjacent to the first source/drain region,
wherein the second extension region includes a first section and a second section that are spaced apart along the longitudinal axis of the gate structure, and the channel region includes a second portion positioned along the longitudinal axis of the gate structure between the first section and the second section of the second extension region.

18. The method of claim 14 further comprising:
forming a first halo region in the substrate,
wherein the first halo region includes a first section beneath the first section of the first extension region and a second section beneath the second section of the the first extension region, the first section and the second section of the first halo region are spaced apart along the longitudinal axis of the gate structure, and the channel region includes a second portion positioned along the longitudinal axis of the gate structure between the first section and the second section of the first halo region.

19. The method of claim 18 further comprising:
forming a second extension region in the substrate adjacent to the second extension region,
wherein the second extension region includes a first section and a second section that are spaced apart along the longitudinal axis of the gate structure, and the channel region includes a third portion positioned along the longitudinal axis of the gate structure between the first section and the second section of the second extension region.

20. The method of claim 19 further comprising:
forming a second halo region in the substrate,
wherein the second halo region includes a first section beneath the first section of the second extension region and a second section beneath the second section of the second extension region, the first section and the second section of the second halo region are spaced apart along the longitudinal axis of the gate structure, and the channel region includes a fourth portion positioned along the longitudinal axis of the gate structure between the first section and the second section of the second halo region.

* * * * *

UNITED STATES PATENT AND TRADEMARK OFFICE
CERTIFICATE OF CORRECTION

PATENT NO. : 11,205,701 B1
APPLICATION NO. : 16/899086
DATED : December 21, 2021
INVENTOR(S) : Henry Aldridge, John J. Ellis-Monaghan and Michel J. Abou-Khalil Page 1 of 1

It is certified that error appears in the above-identified patent and that said Letters Patent is hereby corrected as shown below:

In the Claims

Column 10, Claim 17, Lines 2-3 read:
"...adjacent to the first source/drain region,"
Should read:
--...adjacent to the second source/drain region,--

Column 10, Claim 19, Lines 24-25 read:
"...adjacent to the second extension region,"
Should read:
--...adjacent to the second source/drain region,--

Signed and Sealed this
Twelfth Day of July, 2022

Katherine Kelly Vidal
*Director of the United States Patent and Trademark Office*